(12) United States Patent
Park

(10) Patent No.: US 12,315,766 B2
(45) Date of Patent: May 27, 2025

(54) SEMICONDUCTOR DEVICE INCLUDING SPACER LAYER CONTACTING BIT LINE BOTTOM SIDEWALLS

(71) Applicant: SK hynix Inc., Icheon-si (KR)

(72) Inventor: Kyung Min Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 569 days.

(21) Appl. No.: 17/563,779

(22) Filed: Dec. 28, 2021

(65) Prior Publication Data

US 2023/0047679 A1 Feb. 16, 2023

(30) Foreign Application Priority Data

Aug. 12, 2021 (KR) .................. 10-2021-0106582

(51) Int. Cl.
*H10B 43/27* (2023.01)
*H01L 21/768* (2006.01)
*H01L 23/522* (2006.01)
*H01L 21/311* (2006.01)

(52) U.S. Cl.
CPC .. *H01L 21/76897* (2013.01); *H01L 21/76831* (2013.01); *H01L 23/5226* (2013.01); *H10B 43/27* (2023.02); *H01L 21/31144* (2013.01)

(58) Field of Classification Search
CPC .... H10B 23/5226; H10B 43/27; H10B 43/30; H10B 41/27; H10B 41/30
See application file for complete search history.

(56) References Cited

U.S. PATENT DOCUMENTS

| | | | |
|---|---|---|---|
| 8,330,216 B2 | 12/2012 | Komori et al. | |
| 8,563,378 B2 | 10/2013 | Shim et al. | |
| 10,403,632 B2 | 9/2019 | Ogawa et al. | |
| 2009/0146190 A1* | 6/2009 | Fukuzumi | H10B 43/50 257/E27.103 |
| 2011/0031550 A1* | 2/2011 | Komori | H01L 29/66833 257/E21.21 |
| 2011/0309432 A1* | 12/2011 | Ishihara | H01L 29/7926 257/E21.409 |
| 2015/0179660 A1* | 6/2015 | Yada | H01L 29/40117 257/314 |

(Continued)

FOREIGN PATENT DOCUMENTS

| | | | | |
|---|---|---|---|---|
| JP | 2019165089 A | * | 9/2019 | ............ H01L 27/115 |
| KR | 20170053030 A | * | 5/2017 | ............ H10B 43/27 |

*Primary Examiner* — Ida M Soward

(74) *Attorney, Agent, or Firm* — WILLIAM PARK & ASSOCIATES LTD.

(57) ABSTRACT

A method for fabricating a semiconductor device includes: forming a stack body over a substrate; forming channel structures in the stack body, the channel structures having a channel layer penetrating the stack body; forming a contact-level dielectric layer over the stack body and the channel structures; forming a contact hole penetrating the contact-level dielectric layer; forming contact plugs in the contact hole, the contact plugs coupled to the channel layers of the channel structures; recessing the contact plugs to form upper surfaces of the contact plugs that are lower than an upper surface of the contact-level dielectric layer; forming a bit line-level dielectric layer including a spacer layer over the recessed contact plugs; etching the bit line-level dielectric layer to form trenches that expose the recessed contact plugs; and forming a bit line in one or more of the trenches.

10 Claims, 21 Drawing Sheets

(56) References Cited

U.S. PATENT DOCUMENTS

| | | | |
|---|---|---|---|
| 2015/0179662 A1* | 6/2015 | Makala | H01L 29/40114 |
| | | | 257/314 |
| 2015/0255486 A1* | 9/2015 | Kameoka | H10B 41/35 |
| | | | 257/314 |
| 2016/0093635 A1* | 3/2016 | Rabkin | H01L 21/76877 |
| | | | 257/314 |
| 2016/0204122 A1* | 7/2016 | Shoji | H10B 43/50 |
| | | | 257/314 |
| 2017/0133397 A1* | 5/2017 | Lee | H01L 23/535 |
| 2019/0287994 A1* | 9/2019 | Tanaka | H01L 29/1037 |
| 2020/0144380 A1* | 5/2020 | Hwang | H10B 43/50 |
| 2020/0152654 A1* | 5/2020 | Hwang | H10B 43/27 |
| 2020/0357815 A1* | 11/2020 | Iwai | H10B 41/27 |
| 2022/0005759 A1* | 1/2022 | Lee | H10B 41/27 |

* cited by examiner

SEMICONDUCTOR DEVICE INCLUDING SPACER LAYER CONTACTING BIT LINE BOTTOM SIDEWALLS

CROSS-REFERENCE TO RELATED APPLICATIONS

The present application claims priority of Korean Patent Application No, 10-2021-0106582, filed on Aug. 12, 2021, which is incorporated herein by reference in its entirety.

BACKGROUND

1. Technical Field

Exemplary embodiments of the present invention relate to a semiconductor device, and more particularly, to a vertical semiconductor device and a method for fabricating the vertical semiconductor device.

2. Related Art

As recent information and communication devices are equipped with multiple functions, semiconductor devices are required to have large capacity and high degree of integration. As the size of a semiconductor device for high integration shrinks, the structures of operating circuits and/or interconnections included in the semiconductor device for operation and electrical connection of the semiconductor device are getting more complicated. Accordingly, it is demanded to develop a semiconductor device having excellent electrical characteristics with improved degree of integration.

SUMMARY

In accordance with an embodiment, a method for fabricating a semiconductor device may include: forming a stack body over a substrate; forming channel structures in the stack body, the channel structures comprising a channel layer penetrating the stack body; forming a contact-level dielectric layer over the stack body and the channel structures; forming a contact hole penetrating the contact-level dielectric layer; forming contact plugs in the contact hole, the contact plugs coupled to the channel layers of the channel structures; recessing the contact plugs to form upper surfaces of the contact plugs that are lower than an upper surface of the contact-level dielectric layer; forming a bit line-level dielectric layer including a spacer layer over the recessed contact plugs; etching the bit line-level dielectric layer to form trenches that expose the recessed contact plugs; and forming a bit line in one or more of the trenches.

In accordance with an embodiment, a semiconductor device may include: a memory cell stack comprising dielectric layers and gate electrodes that are alternately stacked with each other, the memory cell stack positioned over a substrate; a plurality of channel structures each including a channel layer that penetrates the memory cell stack; a contact-level dielectric layer formed over the channel structures and including a contact hole that exposes each of the channel structures; recessed contact plugs respectively coupled to the channel layers through the contact hole and having an upper surface which is lower than an upper surface of the contact-level dielectric layer; a bit line-level dielectric layer formed over the recessed contact plugs; and a plurality of bit lines formed in the bit line-level dielectric layer, wherein the bit line-level dielectric layer includes a spacer layer in contact with sidewalls of bottom portions of the bit lines.

DETAILED DESCRIPTION

Figure 1:
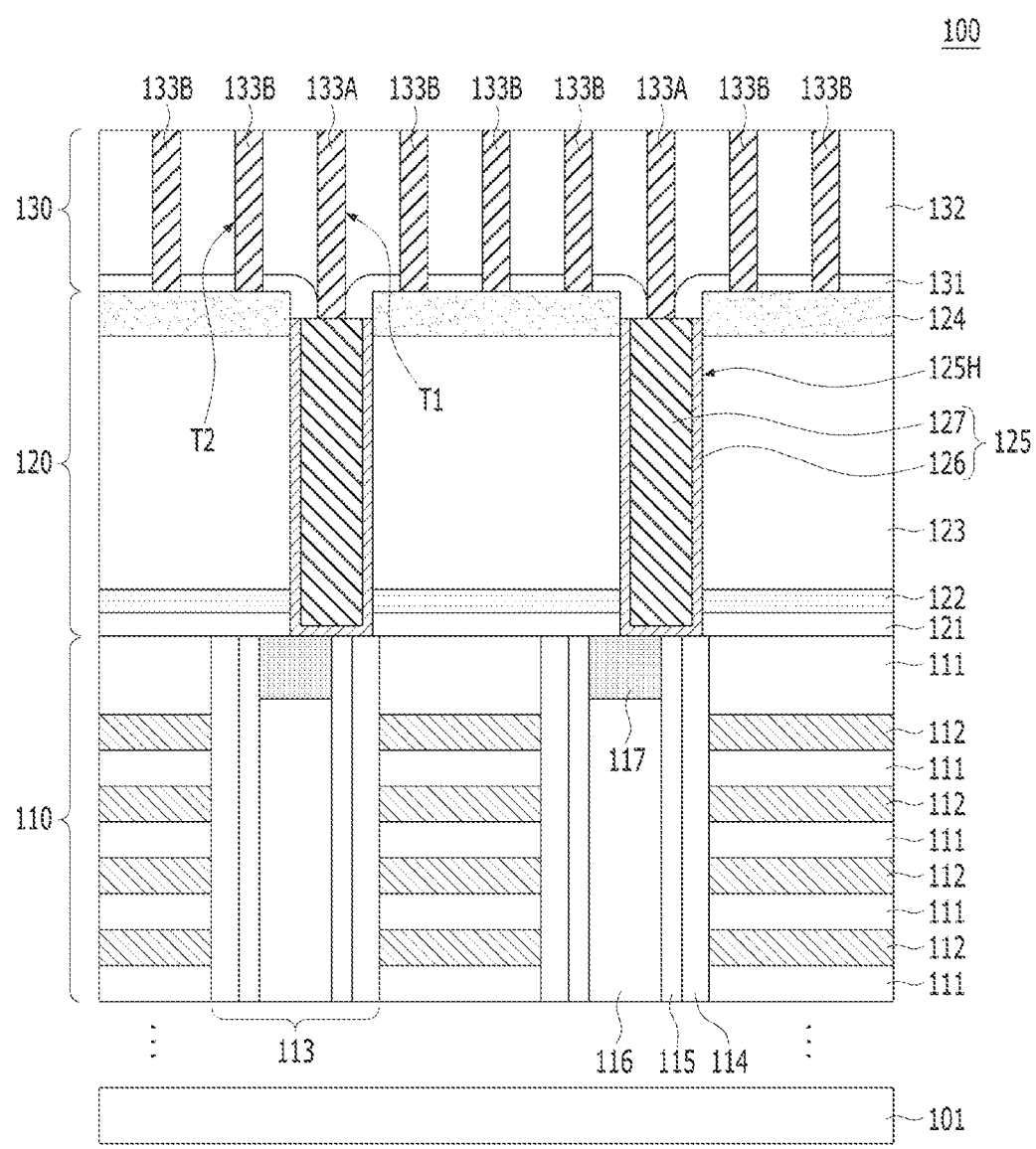
FIG. 1 is a cross-sectional view illustrating a schematic structure of a semiconductor device in accordance with an embodiment of the present invention.

Embodiments will be described below in more detail with reference to the accompanying drawings. The embodiments may, however, be embodied in different forms and should not be construed as limited to the embodiments set forth herein. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It will be understood that when an element or layer is referred to as being "connected to" or "coupled to" another element, structure, or layer etc., it can be directly connected or coupled to the other element, structure, or layer etc., or intervening elements, structures, or layers etc., may be present. In contrast, when an element is referred to as being "directly connected to" or "directly coupled to" another element, structure, or layer etc., there are no intervening elements or layers present.

Embodiments of the present disclosure may be directed to a semiconductor device capable of securing contact margins, and a method for fabricating the semiconductor device, FIG. 1 is a cross-sectional view illustrating a schematic structure of a semiconductor device in accordance with an embodiment.

Referring to FIG. 1, a semiconductor device 100 may include a memory cell stack 110 disposed over a substrate 101. The semiconductor device 100 may include a vertical NAND.

The substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof or a multi-layer thereof. The substrate 101 may include other semiconductor materials, such as germanium. The substrate 101 may include a III/V-group semiconductor substrate, for example, a compound semiconductor substrate, such as GaAs. The substrate 101 may include a Silicon-On-Insulator (SOT) substrate. Although not illustrated, a peripheral circuit transistor may be formed over the substrate 101.

In the memory cell stack 110, dielectric layers 111 and gate electrodes 112 may be vertically alternately stacked.

The memory cell stack 110 may further include a plurality of channel structures 113 penetrating the dielectric layers 111 and the gate electrodes 112. The channel structure 113 may include a memory layer 114 and a channel layer 115. The memory layer 114 may include an ONO structure. The ONO structure may include a stack of an oxide, a nitride and an oxide. The memory layer 114 may include a stack of a blocking layer, a charge trapping layer, and a tunnel dielectric layer. The blocking layer and the tunnel dielectric layer may include an oxide, and the charge trapping layer may include a nitride. The channel layer 115 may include a polysilicon layer. According to another embodiment, the blocking layer may include a high-k material, and the high-k material may include aluminum oxide or hafnium oxide. The channel layer 115 may have a cylinder shape having an inner space. The memory layer 114 may surround an outer wall of the channel layer 115. The channel structure 113 may further include a core dielectric layer 116. The inner space of the channel layer 115 may be completely filled with the core dielectric layer 116. The core dielectric layer 116 may include silicon oxide or silicon nitride. A conductive pad 117 coupled to an upper end of the channel layer 115 may be further formed over the core dielectric layer 117.

The gate electrodes 112 may surround the channel structure 113. The channel structure 113 may vertically penetrate the dielectric layers 111 and the gate electrodes 112. The channel structure 113 may be referred to as a 'vertical channel structure' or a 'pillar channel structure'.

A contact-level dielectric layer 120 may be formed over the conductive pad 117. Contact plugs 125 penetrating the contact-level dielectric layer 120 may be formed. A contact hole 125H may be formed in the contact-level dielectric layer 120, and a contact plug 125 may be formed in the contact hole. Each contact plug 125 may be coupled to each channel layer 115. The contact plugs 125 may have an upper surface which is lower than the upper surface of the contact-level dielectric layer 120, and the contact plugs 125 having this shape may be referred to as 'recessed contact plugs'. The contact plugs 125 may penetrate the contact-level dielectric layer 120, and the individual contact plugs 125 may be electrically connected to the conductive pad 117 and the channel layer 115. The contact-level dielectric layer 120 may include a first inter-layer dielectric layer 121, a first etch stop layer 122, a second inter-layer dielectric layer 123, and a second etch stop layer 124.

A bit line-level dielectric layer 130 may be formed over the contact-level dielectric layer 120, and a plurality of bit lines 133A and 133B may be formed in the bit line-level dielectric layer 130. The bit line-level dielectric layer 130 may include a spacer layer 131 and a third inter-layer dielectric layer 132. The bit lines 133A and 133B may be formed by a double patterning process. As for the method of forming the bit lines 133A and 133B, FIGS. 2A to 33 may be referred to. The spacer layer 131 may cover upper surface edges of the contact plugs 125. The spacer layer 131 may include silicon nitride. The upper surfaces of the contact plugs 125 may be positioned at a level lower than the upper surfaces of the second etch stop layer 124. In other words, the upper surfaces of the contact plugs 125 may be recessed lower than the upper surface of the second etch stop layer 124.

The bit lines 133A and 133B may be formed in the trenches T1 and T2, respectively. The trenches T1 and T2 are laterally disposed to each other and include first trenches T1 exposing the contact plugs 125 and second trenches T2 between the first trenches T1. For example, at least three second trenches T2 may be positioned between the neighboring first trenches T1. The first trenches T1 and the second trenches T2 may be separated from each other by the spacer layer 131. The bottom surfaces of the first trenches T1 may be positioned at a lower level than the bottom surfaces of the second trenches T2.

The line widths of the bit lines 133A and 133B may be smaller than the line widths of the contact plugs 125. For example, the line widths of the contact plugs 125 may be approximately three times as great as the line widths of the bit lines 133A and 133B. For the sake of convenience in description, the bit lines 133A contacting the contact plugs 125 may be simply referred to as a 'first bit line 133A' or an 'active bit line', and the bit lines 133B that do not contact the contact plugs 125 may be simply referred to as a 'second bit line 133B' or a 'passing bit line'. Three second bit lines 133B may be positioned between the neighboring first bit lines 133A. Although not illustrated, the second bit lines 133B may also be coupled to other contact plugs (not shown).

The bottom portions of the first and second bit lines 133A and 133B, that is, bit line contact portions may be self-aligned to the spacer layer 131. The first bit lines 133A and the contact plugs 125 may directly contact each other. In other words, additional bit line contact plugs might not be formed between the first and second bit lines 133A and 133B and the contact plugs 125.

The second etch stop layer 124 may be covered by the spacer layer 131. The second etch stop layer 124 and the spacer layer 131 may include the same material. The spacer layer 131 may include a rounding portion, and the rounding portion of the spacer layer 131 may cover edges of the second etch stop layer 124 over the contact plug 125. The rounding portion of the spacer layer 131 may contact bit line contact portions of the first bit lines 133A.

As described above, the contact plugs 125 and the channel structure 113 may be directly coupled. Additional contact plugs might not be positioned between the contact plugs 125 and the channel structure 113. The contact plugs 125 may have a single contact structure including one contact plug 125, rather than a multi-layer structure of a plurality of contact plugs.

Since the contact plugs 125 have a larger line width than the bit lines 133A and 133B, the contact area between the contact plugs 125 and the channel structure 113 may be increased, thereby improving the contact resistance.

As a comparative example, when the line widths of the contact plugs 125 are smaller than the bit lines 133A and 133B, the contact area between the contact plugs 125 and the channel structure 113 may be reduced, thus increasing the contact resistance. Also, an overlay margin of the contact plugs 125 and the channel structure 113 may be reduced.

According to an embodiment, since additional contact plugs are not formed between the contact plugs 125 and the channel structure 113, the process may be simplified.

FIGS. 2A to 2L are cross-sectional views illustrating a method for fabricating a semiconductor device in accordance with an embodiment.

Figure 2A:
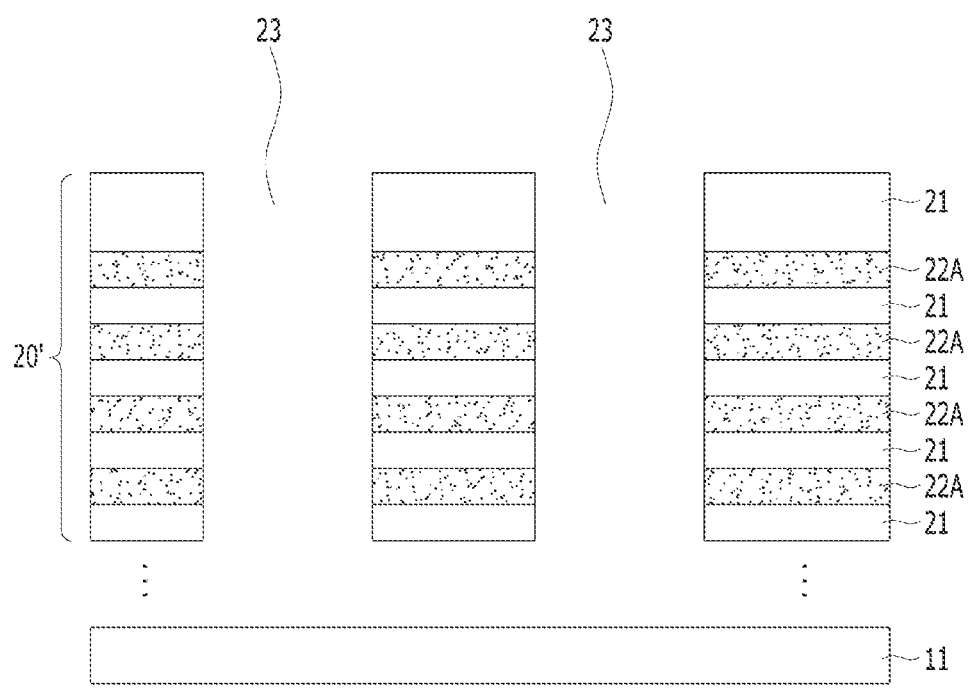
FIGS. 2A, 2B, 2C, 2D, 2E, 2F, 2G, 2H, 2I, 2J, 2K, and 2L are cross-sectional views illustrating a method for fabricating a semiconductor device in accordance with an embodiment of the present invention.

Referring to FIG. 2A, a stack body 20' may be formed over a substrate 11. The substrate 11 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multilayer thereof. The substrate 11 may include other semiconductor materials, such as germanium. The substrate 11 may include a III/V-group semiconductor substrate, for example, a compound semiconductor substrate, such as GaAs. The substrate 11 may include a Silicon-On-Insulator (SOI) substrate. Although not illustrated, a peripheral circuit transistor may be formed over the substrate 11.

The stack body 20' may include dielectric layers 21 and sacrificial layers 22A. In the stack body 20', the dielectric layers 21 and the sacrificial layers 22A may be alternately stacked. The dielectric layers 21 and the sacrificial layers 22A may alternate vertically from the surface of the substrate 11. The dielectric layers 21 and the sacrificial layers 22A may be formed of different materials. The sacrificial layers 22A may have an etch selectivity with respect to the dielectric layers 21. The dielectric layers 21 may be silicon oxide, and the sacrificial layers 22A may be silicon nitride. The uppermost dielectric layer 21 may be thicker than the other dielectric layers 21. The dielectric layers 21 and the sacrificial layers 22A may be formed by Chemical Vapor Deposition (CVD) or Atomic Layer Deposition (ALD).

Although not illustrated, after the stack body 20' is formed, a step structure (not shown) may be formed in a region where a pad portion of the stack body 20' is to be formed.

Subsequently, channel openings 23 may be formed in the stack body 20'. The channel openings 23 may vertically penetrate the stack body 20'.

Figure 2B:
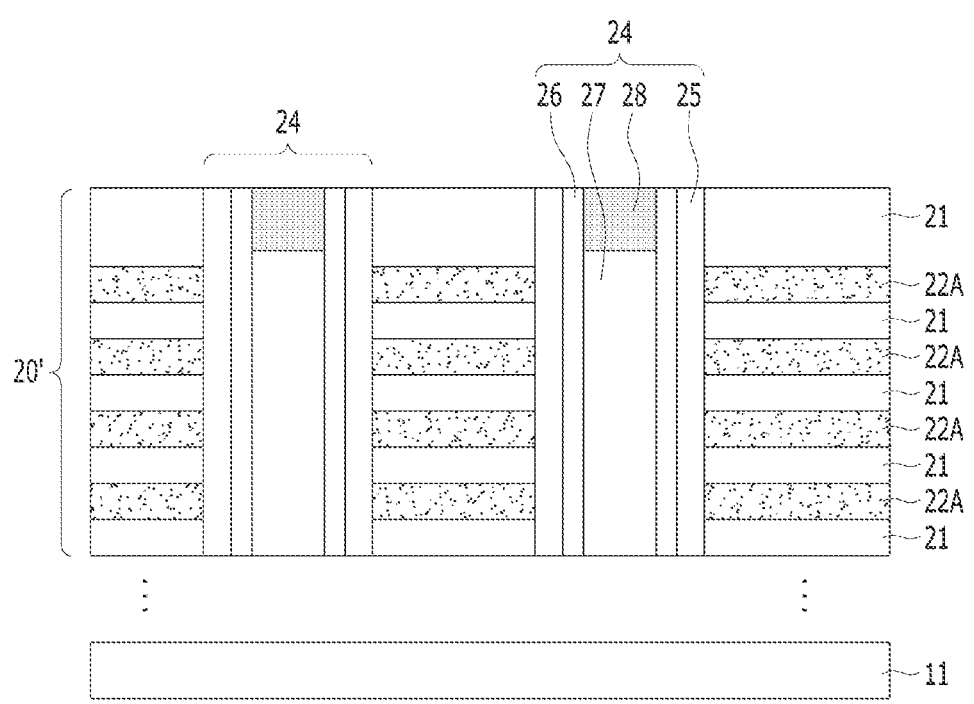

Referring to FIG. 2B, a channel structure 24 may be formed in the channel opening 23. The channel structure 24 may extend vertically from the substrate 11. The channel structure 24 may include a memory layer 25 and a channel layer 26. The memory layer 25 may be formed on a sidewall of the channel opening 23 and surround an outer wall of the channel layer 26. The memory layer 25 may be a stack including at least a charge trapping layer. For example, in the memory layer 25, a blocking layer, a charge trapping layer, and a tunnel dielectric layer may be sequentially stacked. The memory layer 25 may include a stack of silicon oxide, silicon nitride, and silicon oxide, wherein the silicon nitride may serve as a charge trapping layer. The channel layer 26 may include silicon, for example, polysilicon. The memory layer 25 may include an ONO structure, and the ONO structure may include a stack of an oxide, a nitride, and an oxide. According to another embodiment, the blocking layer of the memory layer 25 may include a high-k material, and the high-k material may include aluminum oxide or hafnium oxide. The channel layer 26 may have a cylinder shape having an inner space. A memory layer 25 may surround an outer wall of the channel layer 26.

The channel structure 24 may further include a core dielectric layer 27 and a conductive pad 28 over the core dielectric layer 27. The core dielectric layer 27 may partially fill the inside of the channel layer 26, and the conductive pad 28 may be positioned over the core dielectric layer 27. The conductive pad 28 may contact the upper inner wall of the channel layer 26. The core dielectric layer 27 may include silicon oxide. The conductive pad 28 may include polysilicon, for example, polysilicon which is doped with an impurity.

Figure 2C:
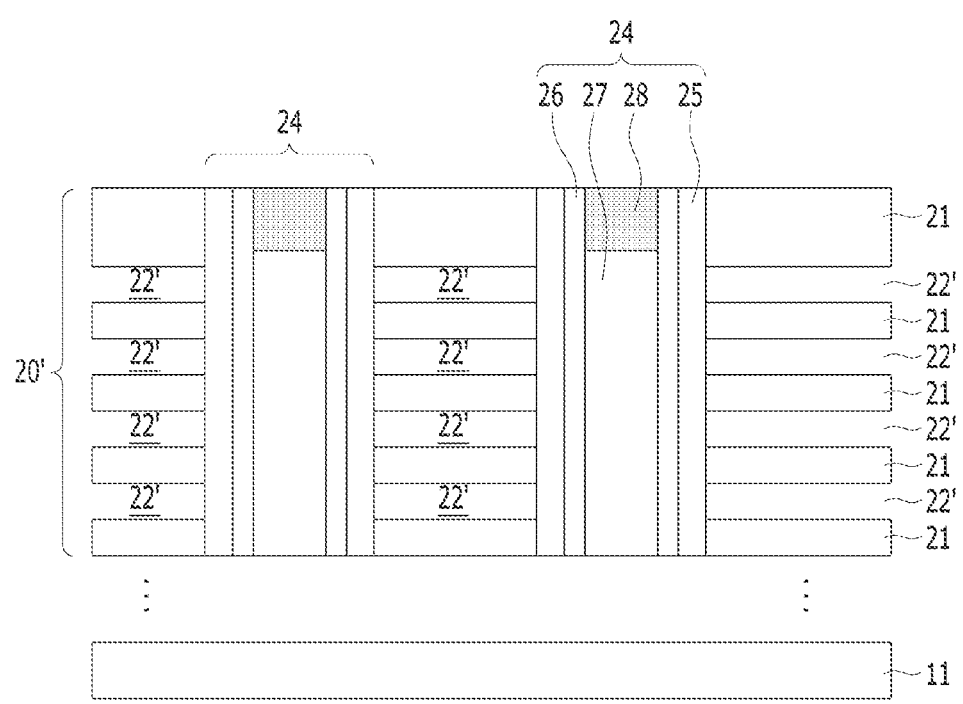

Referring to FIG. 2C, portions of the stack body 20', for example, the sacrificial layers 22A, may be selectively removed. As a result, lateral recesses 22' may be formed between the dielectric layers 21. The lateral recesses 22' may be referred to as lateral air gaps. The lateral recesses 22' and the dielectric layers 21 may be alternately stacked. When the sacrificial layers 22A include silicon nitride, the sacrificial layers 22A may be removed by a chemical including phosphoric acid ($H_3PO_4$).

Figure 2D:
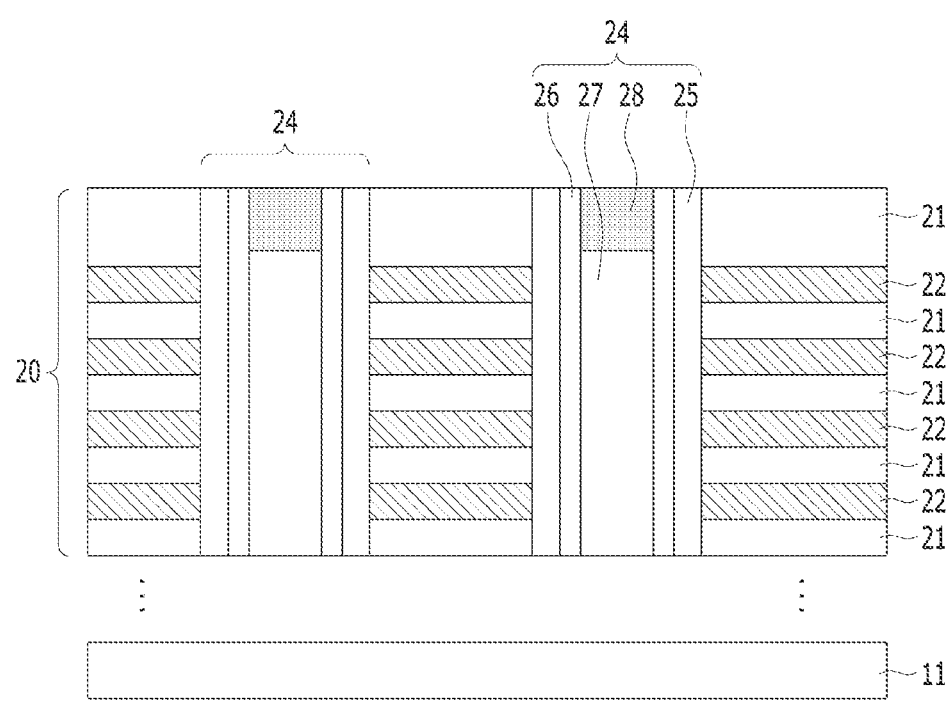

Referring to FIG. 2D, gate electrodes 22 may be formed. The gate electrodes 22 may fill the lateral recesses 22', respectively. The channel structures 24, the dielectric layers 21, and the gate electrodes 22 may form the memory cell stack 20. In the memory cell stack 20, the dielectric layers 21 and the gate electrodes 22 may be alternately stacked, and a plurality of the channel structures 24 may penetrate the dielectric layers 21 and the gate electrodes 22.

The gate electrodes 22 may include a low-resistance material. The gate electrodes 22 may be a metal-based material. The gate electrodes 22 may include a metal, a metal silicide, a metal nitride, or a combination thereof. For example, the metal may include nickel, cobalt, platinum, titanium, tantalum or tungsten. The metal silicide may include nickel silicide, cobalt silicide, platinum silicide, titanium silicide, tantalum silicide or tungsten silicide. The gate electrodes 22 may include titanium nitride and tungsten.

Figure 2E:
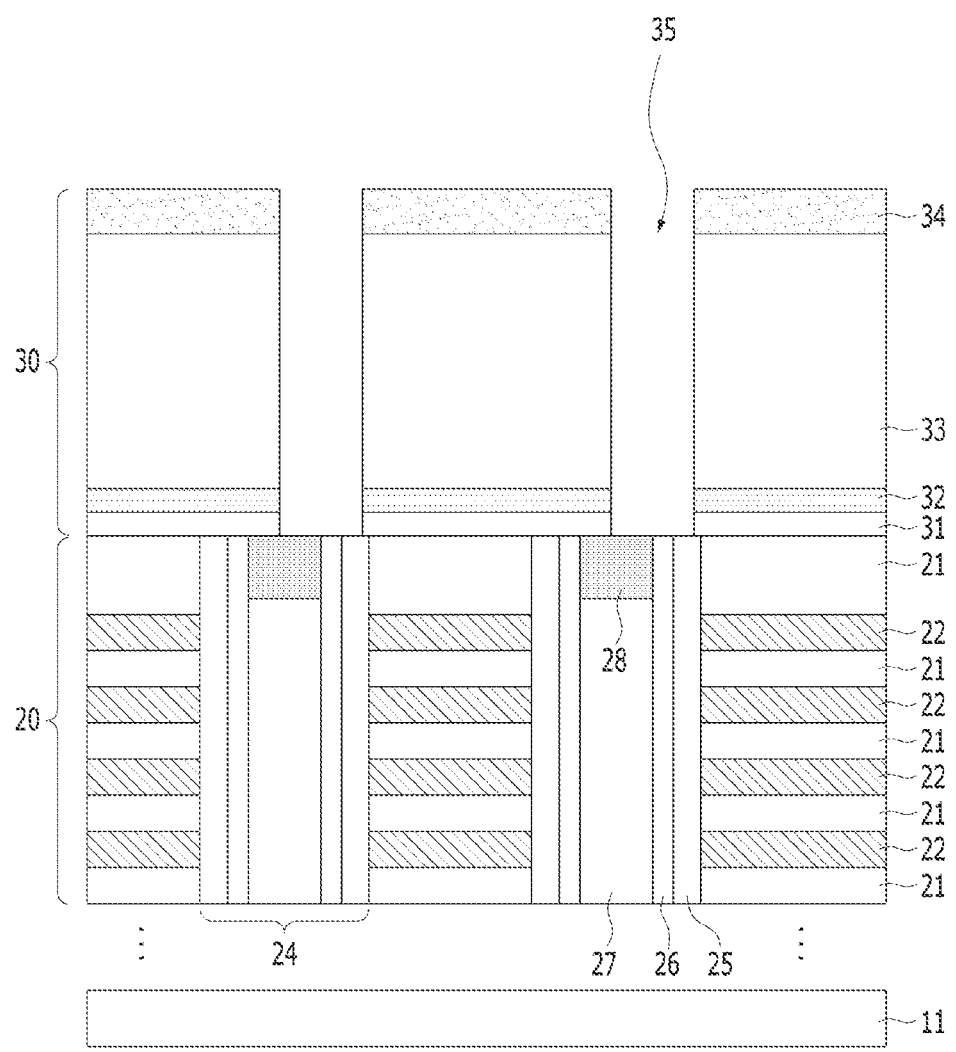

Referring to FIG. 2E, a contact-level dielectric layer 30 may be formed over the memory cell stack 20. The contact-level dielectric layer 30 may have a multi-layer level structure including a plurality of dielectric layers. For example, the contact-level dielectric layer 30 may include a first inter-layer dielectric layer 31, a first etch stop layer 32, a second inter-layer dielectric layer 33, and a second etch stop layer 34. The first and second inter-layer dielectric layers 31 and 33 may be formed of silicon oxide, and the first and second etch stop layers 32 and 34 may be formed of silicon nitride. According to another embodiment, the first and second inter-layer dielectric layers 31 and 33 may include carbon-containing silicon oxide, and the first and second etch stop layers 32 and 34 may include carbon-containing silicon nitride.

Subsequently, a contact hole 35 may be formed in the contact-level dielectric layer 30. The contact hole 35 may be formed by etching the contact-level dielectric layer 30, and the contact hole 35 may penetrate the contact-level dielectric layer 30. The contact hole 35 may expose a portion of the conductive pad 28. The contact hole 35 may expose the channel layer 26 of the channel structure 24.

Figure 2F:
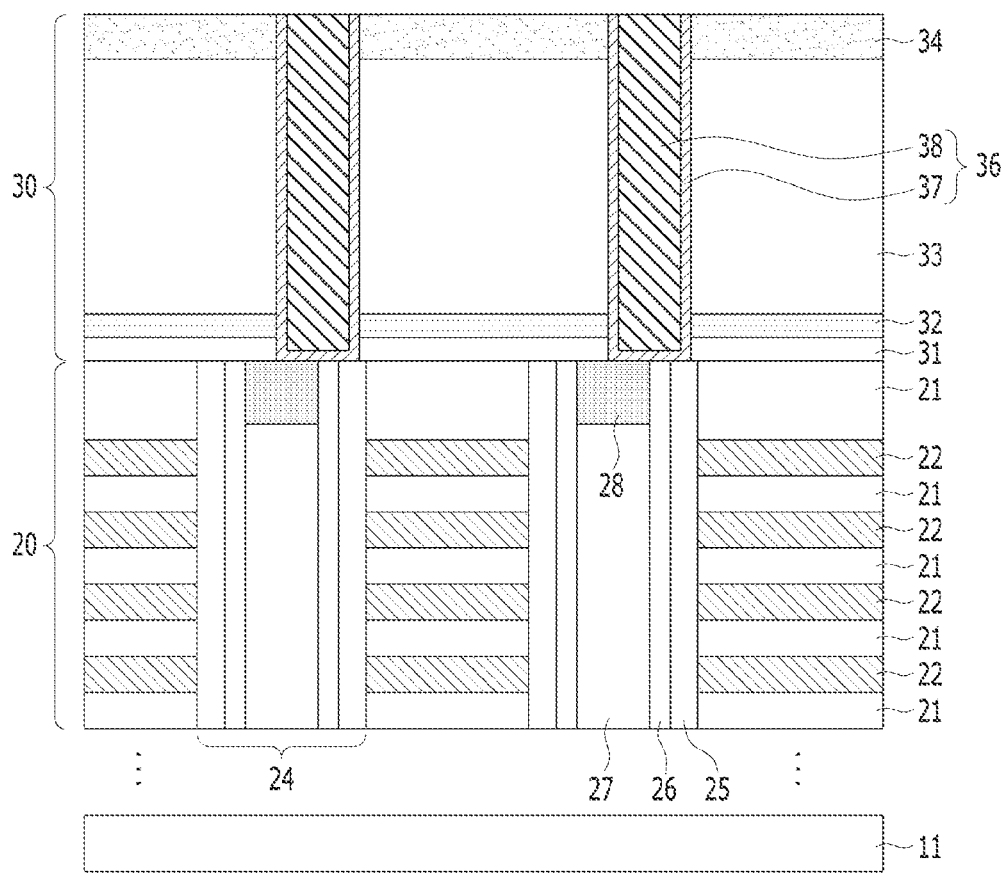

Referring to FIG. 2F, a contact plug 36 filling the contact hole 35 may be formed. The contact plug 36 may include a metal, a metal nitride, or a combination thereof. The contact plug 36 may include a barrier layer 37 and a plug material 38. The barrier layer 37 may be titanium nitride, and the plug material 38 may be tungsten. The contact plug 36 may be electrically connected to the conductive pad 28 and the channel layer 26.

Figure 2G:
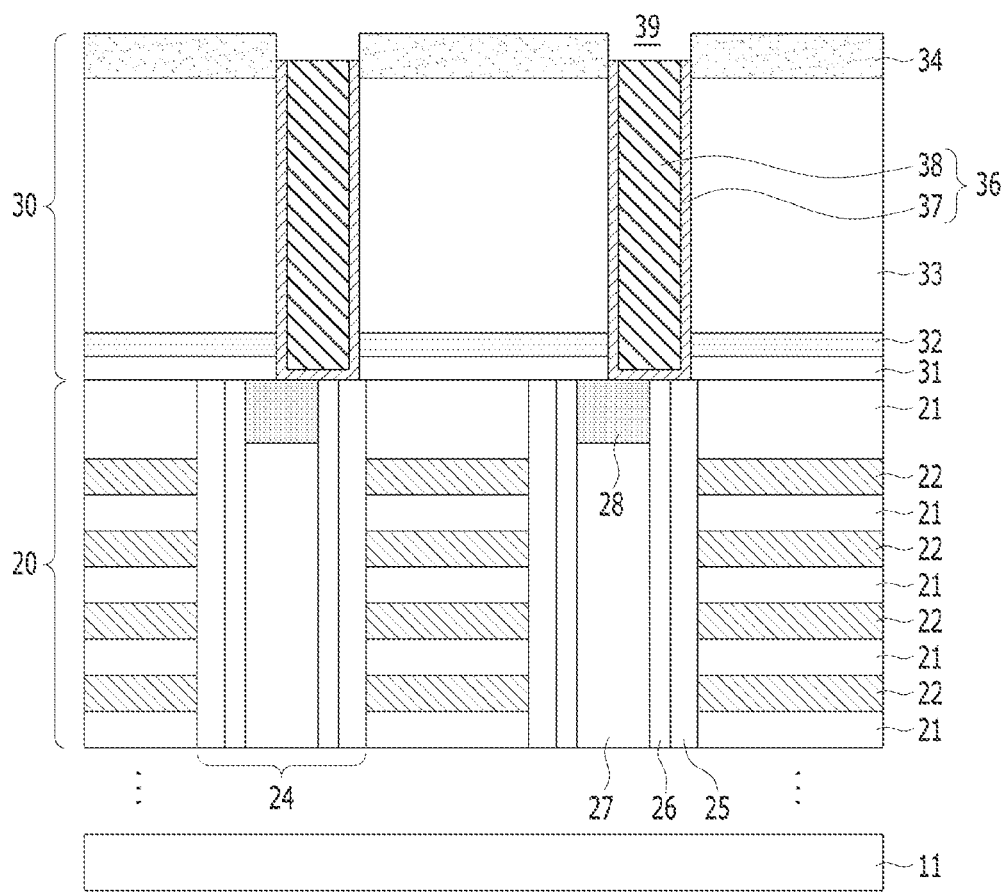

Referring to FIG. 2G, the upper surface of the contact plug 36 may be recessed. As a result, a recess portion 39 may be formed over the contact plug 36. Due to the recess portion 39, the upper surface of the contact plug 36 may be positioned at a lower level than the upper surface of the second etch stop layer 34. Hereinafter, the contact plug 36 may be simply referred to as a recessed contact plug 36.

Figure 2H:
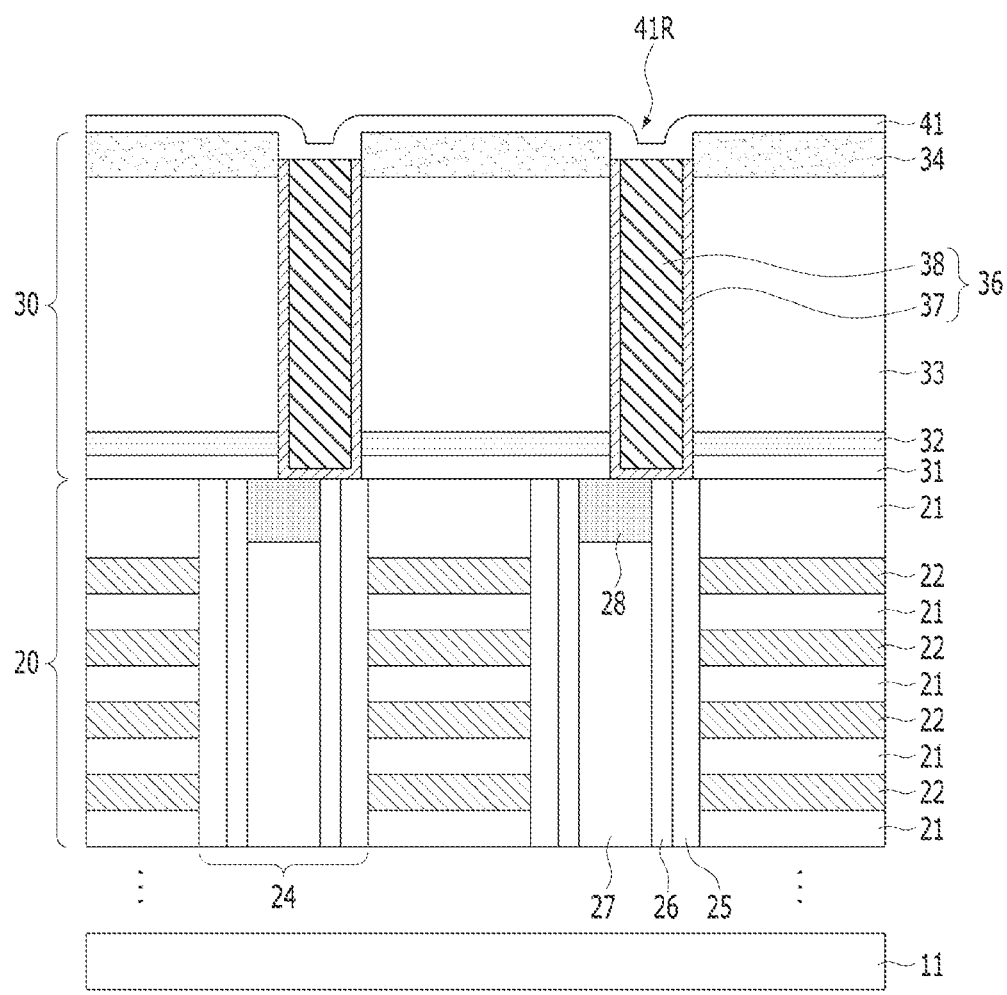
Figure 2I:
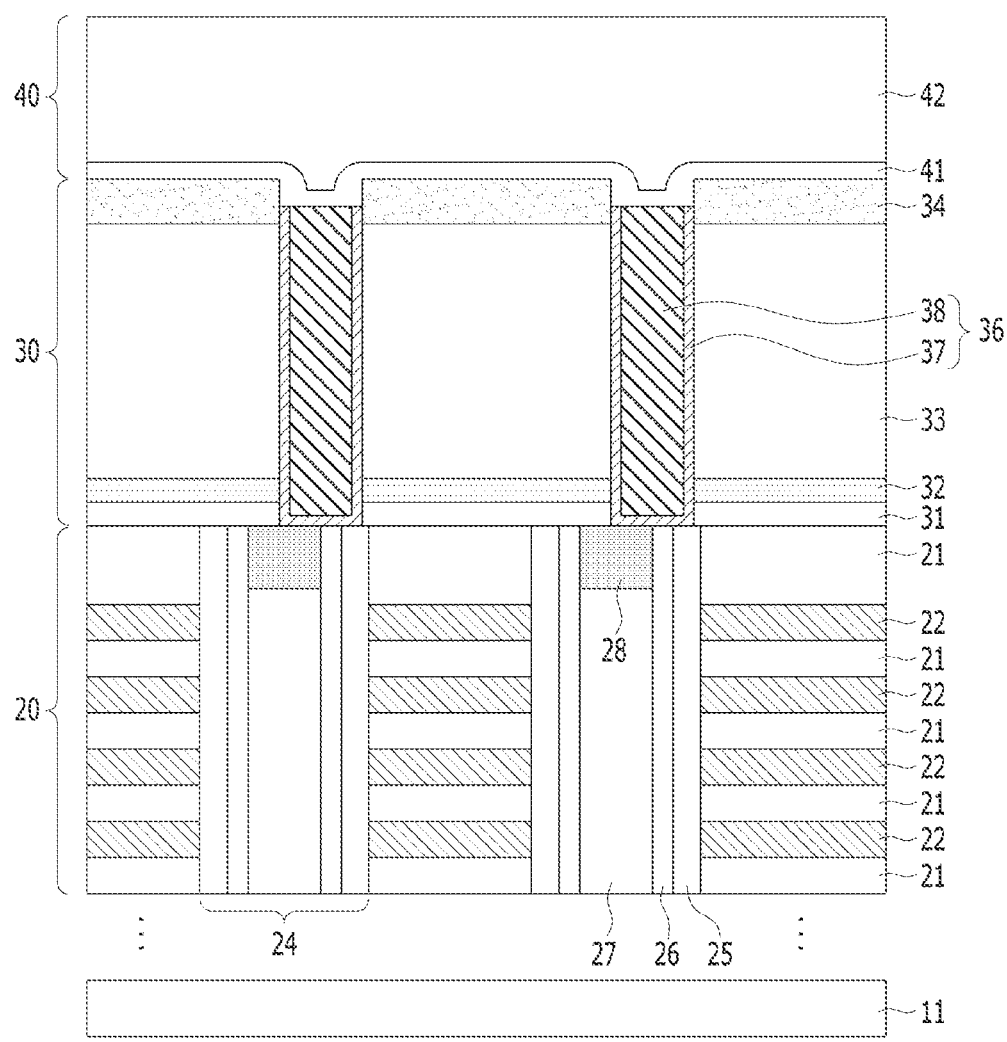

Referring to FIGS. 2H and 2I, a bit line-level dielectric layer 40 may be formed over the recessed contact plug 36. The bit line-level dielectric layer 40 may have a multi-layer-level structure including a plurality of dielectric layers. For example, the bit line-level dielectric layer 40 may be formed by forming a spacer layer 41 and then forming a third inter-layer dielectric layer 42 over the spacer layer 41. The spacer layer 41 may be silicon nitride, and the third inter-layer dielectric layer 42 may be silicon oxide. According to another embodiment, the third inter-layer dielectric layer 42 may include carbon-containing silicon oxide, and the spacer layer 41 may include carbon-containing silicon nitride.

The spacer layer 41 may cover the upper surface of the recessed contact plug 36 and the upper surface of the second etch stop layer 34. The spacer layer 41 may include a plurality of rounding portions 41R, and the rounding portions 41R may cover the edges of the second etch stop layer 34 providing a recessed portion (39 in FIG. 2G). The rounding portions 41R of the spacer layer 41 may partially fill the recess portion 39 of FIG. 2G.

Figure 2J:
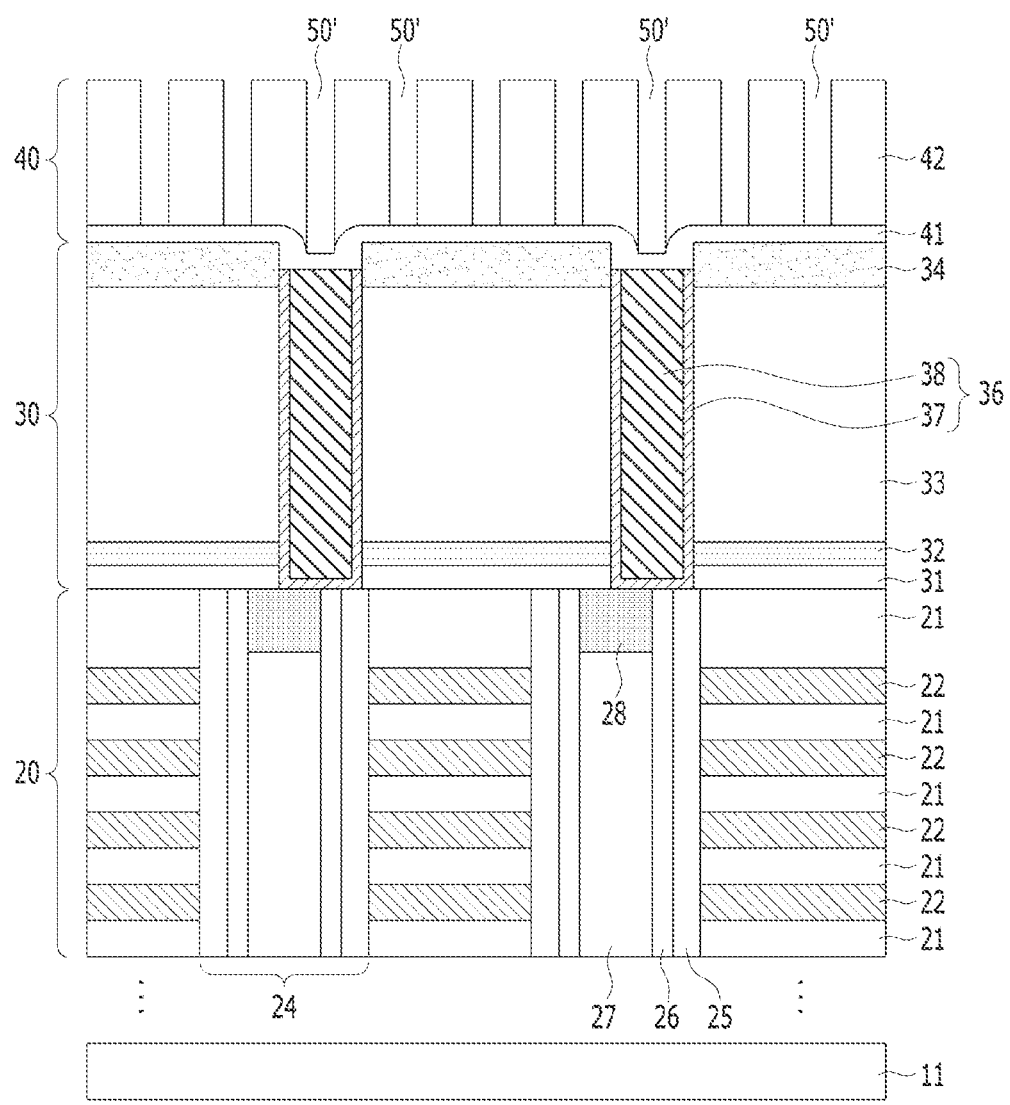
Figure 2K:
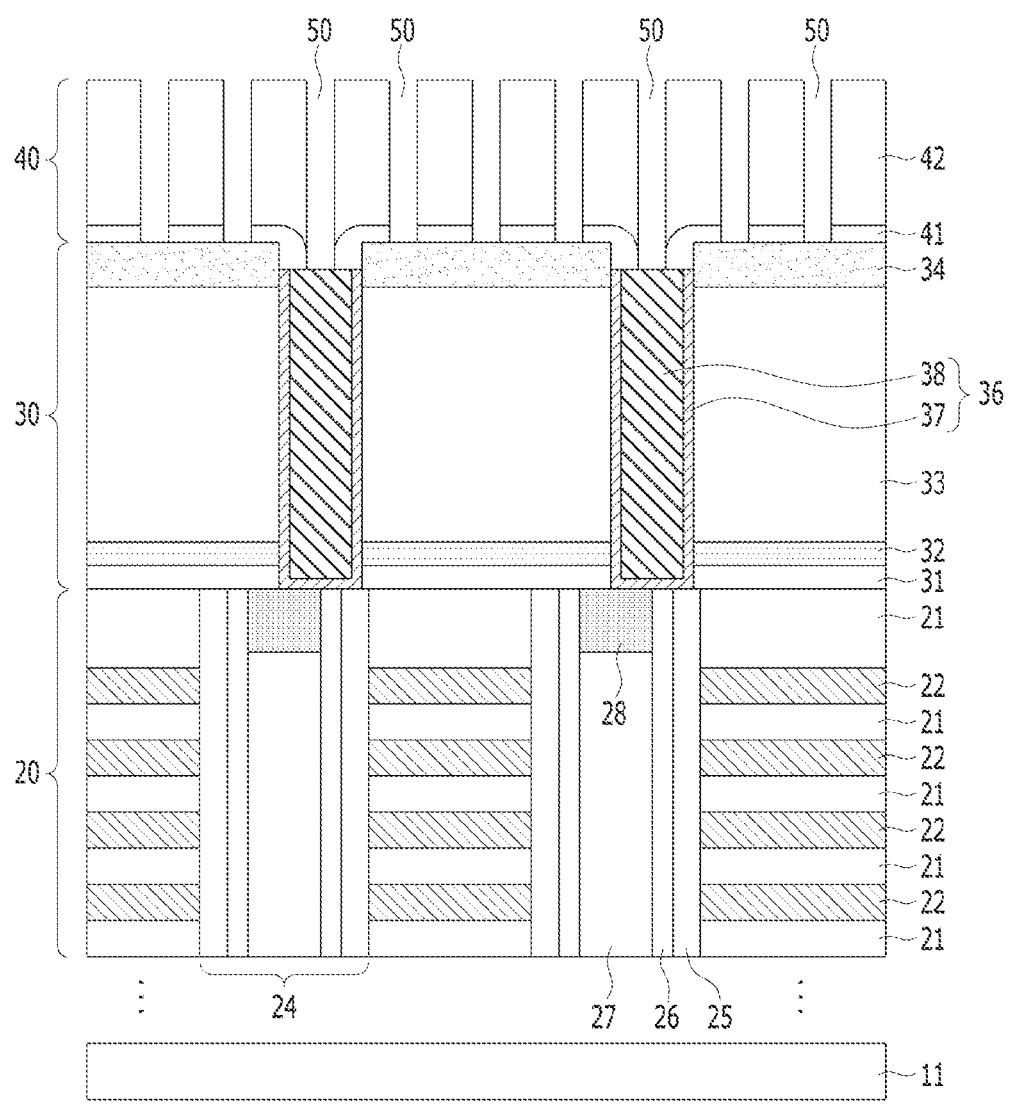

Referring to FIGS. 2J and 2K, a plurality of trenches 50 may be formed in the bit line-level dielectric layer 40. The trenches 50 may be features that provide a space where a bit line is to be formed, and a portion of the trenches 50 may expose surfaces of the recessed contact plug 36. The other portion of the trenches 50 may expose the surface of the second etch stop layer 34.

Double patterning may be performed to form the trenches 50. The trenches 50 may be referred to as a damascene pattern.

The process of forming the trenches 50 may include forming a preliminary trench 50' (see FIG. 2J) by etching the third inter-layer dielectric layer 42, and etching the spacer layer 41 (see FIG. 2K) below the preliminary trench 50' in order to form the trenches 50. As described above, the trenches 50 may be formed by sequentially etching the third inter-layer dielectric layer 42 and the spacer layer 41. The double patterning process for forming the preliminary trenches 50' will be described with reference to FIGS. 3A to 3H.

The spacer layer 41 may serve as an etch stop layer during an etching process for forming the preliminary trenches 50'.

Figure 2L:
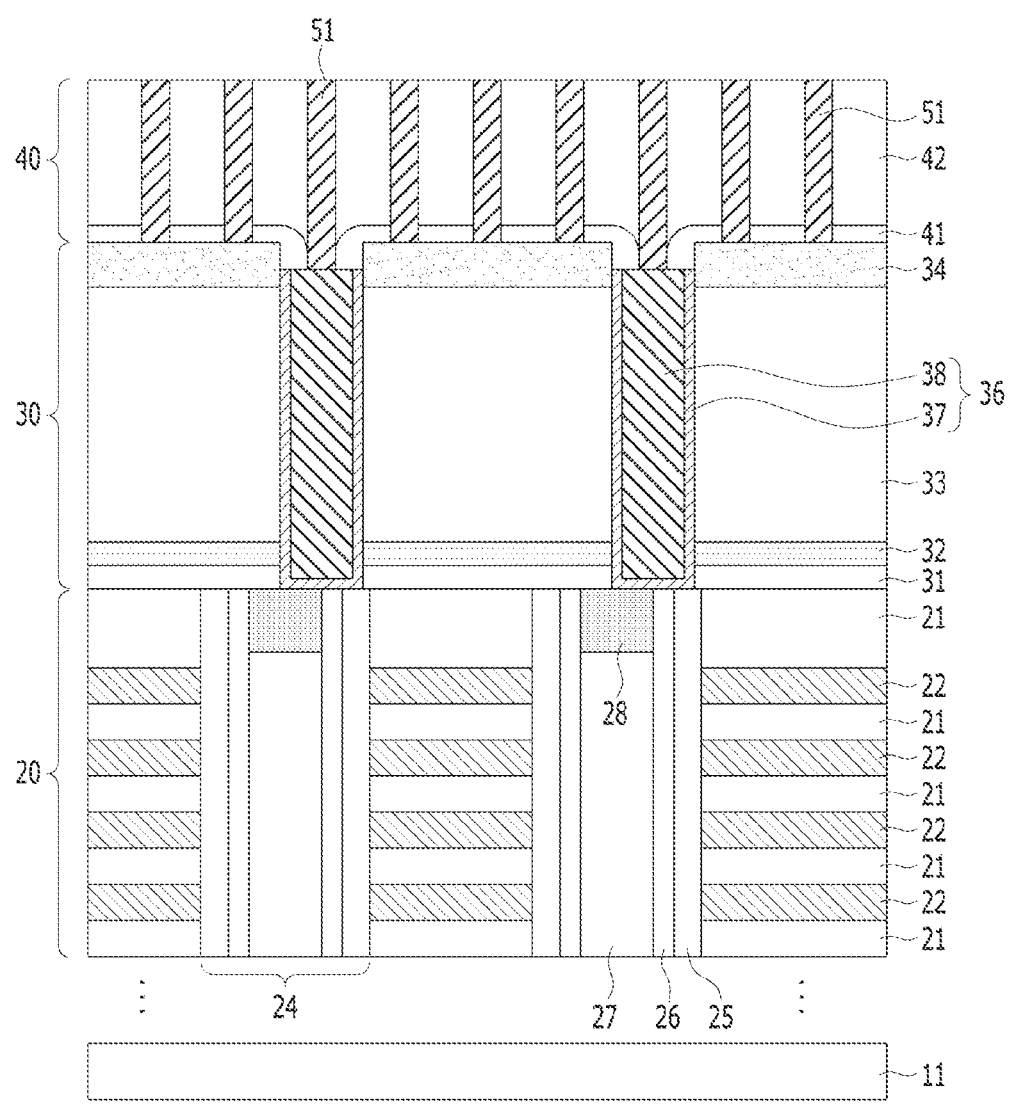

Referring to FIG. 2L, bit lines 51 filling the trenches 50 may be formed. The bit lines 51 may include a metal, a metal nitride, or a combination thereof. The bit lines 51 may include titanium nitride and tungsten. The bit lines 51 may be formed of tungsten alone.

Hereinafter, a method of forming the trenches 50 and the bit lines 51 will be described. For the sake of convenience in description, the memory cell stack 20 and the substrate 11 will be omitted.

FIGS. 3A to 3H are cross-sectional views illustrating a method for forming preliminary trenches 50' shown in FIG. 2J.

Figure 3A:
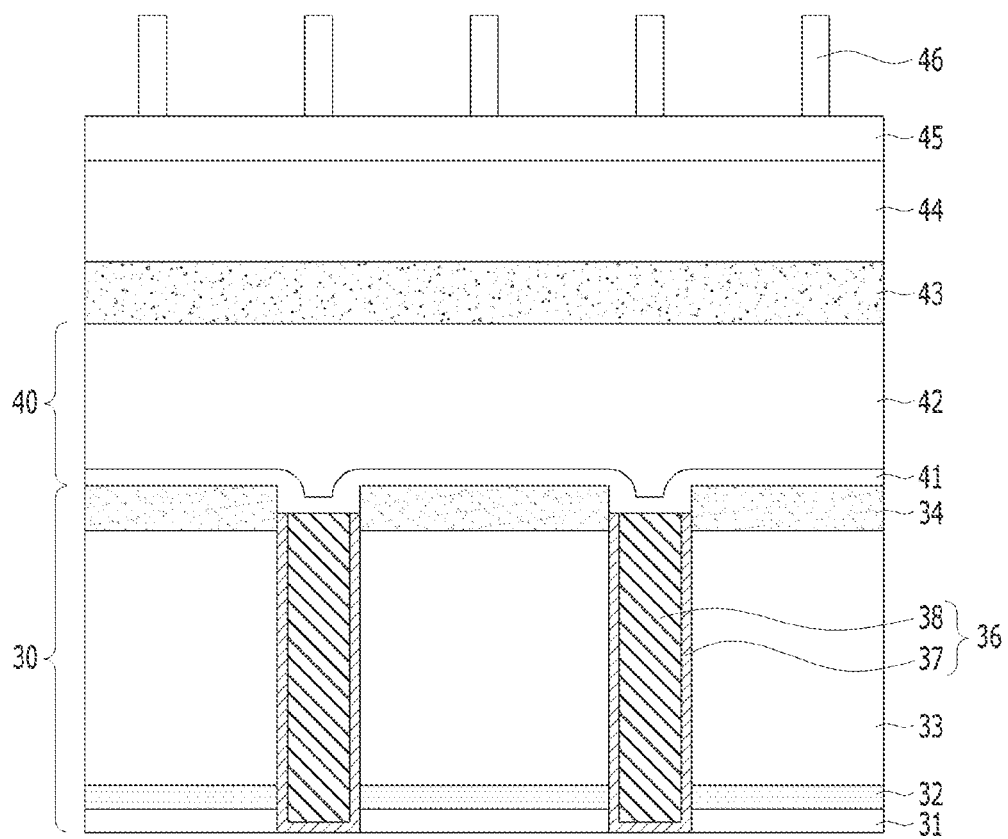
FIGS. 3A, 3B, 3C, 3D, 3E, 3F, 3G, and 3H are cross-sectional views illustrating a method for forming preliminary trenches 50' shown in FIG. 2.

Referring to FIG. 3A, a first hard mask layer 43 may be formed over the bit line-level dielectric layer 40. The first hard mask layer 43 may have an etch selectivity with respect to the third inter-layer dielectric layer 42. The first hard mask layer 43 may include polysilicon.

A second hard mask layer 44 may be formed over the first hard mask layer 43. The second hard mask layer 44 may have an etch selectivity with respect to the first hard mask layer 43 and the third inter-layer dielectric layer 42. The second hard mask layer 44 may include an amorphous carbon layer.

A third hard mask layer 45 may be formed over the second hard mask layer 44. The third hard mask layer 45 may have an etch selectivity with respect to the second hard mask layer 44, the first hard mask layer 43, and the third inter-layer dielectric layer 42. The third hard mask layer 45 may include silicon oxynitride. The third hard mask layer 45 may also be referred to as an anti-reflection layer.

Subsequently, a mask layer 46 may be formed over the third hard mask layer 45. The mask layer 46 may include a photoresist pattern. The mask layer 46 may extend long in one direction. For example, the mask layer 46 may be a photoresist pattern of a line-shape.

Figure 3B:
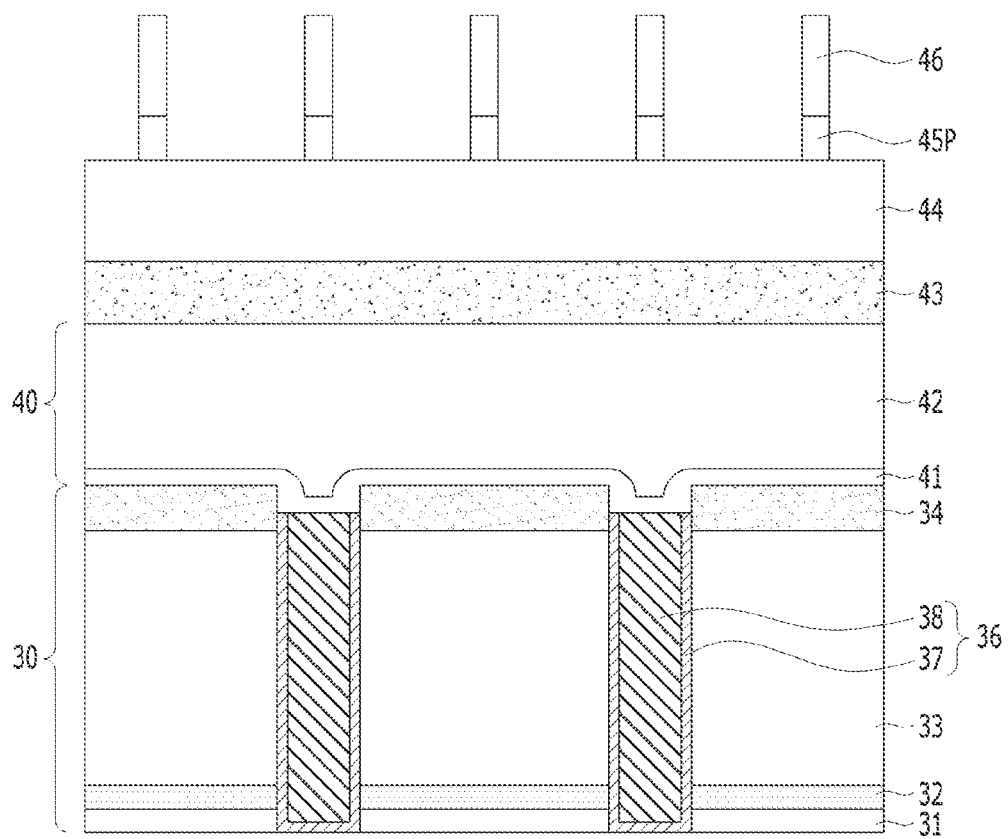

Referring to FIG. 3B, the third hard mask layer 45 may be etched by using the mask layer 46. As a result, a third hard mask layer pattern 45P may be formed over the second hard mask layer 44. The third hard mask layer pattern 45P may extend long in one direction.

Figure 3C:
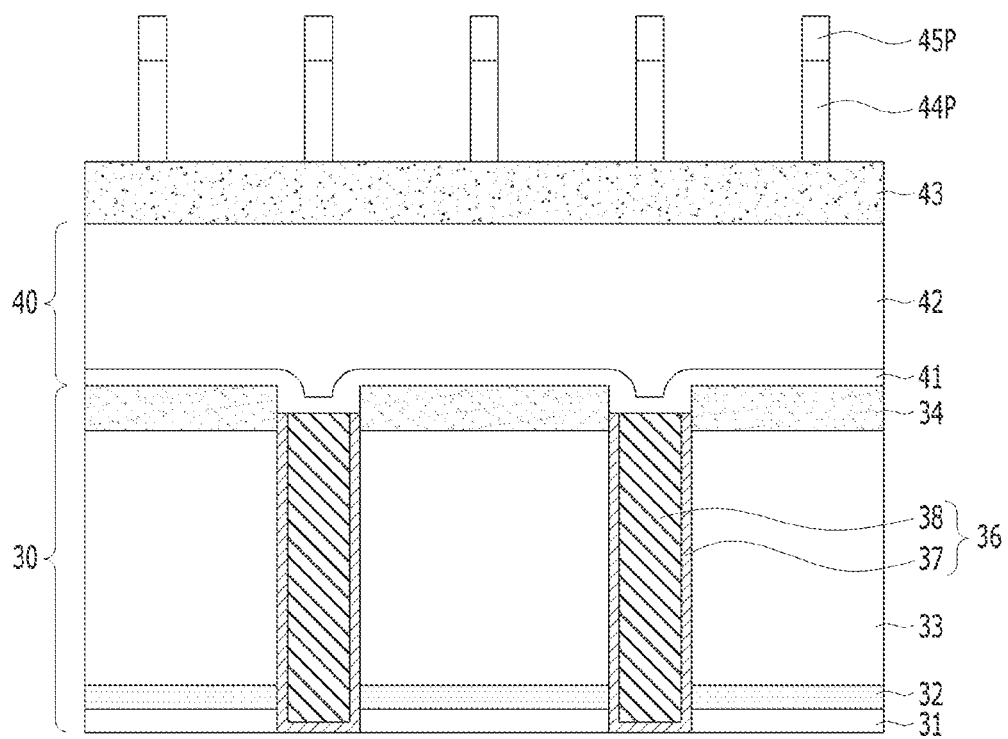

Referring to FIG. 3C, the second hard mask layer 44 may be etched by using the mask layer 46 and the third hard mask layer pattern 45P. As a result, a second hard mask layer pattern 44P may be formed over the first hard mask layer 43. The second hard mask layer pattern 44P may extend long in one direction. The second hard mask layer pattern 44P may be an amorphous carbon layer pattern.

Subsequently, the mask layer 46 may be removed.

According to another embodiment, after the mask layer 46 is removed, the second hard mask layer 44 may be etched by using the third hard mask layer pattern 45P as an etch barrier.

Figure 3D:
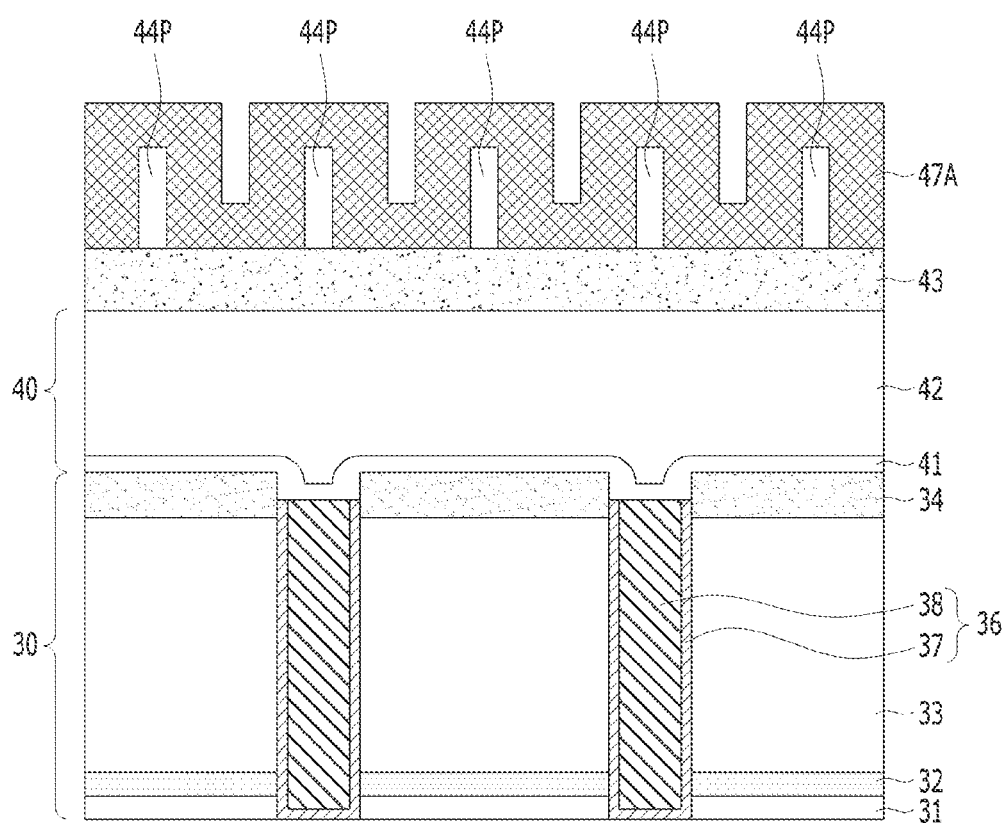

Referring to FIG. 3D, after the third hard mask layer pattern 45P is removed, a sacrificial spacer layer 47A may be formed over the second hard mask layer pattern 44P. The sacrificial spacer layer 47A may include silicon oxide.

Figure 3E:
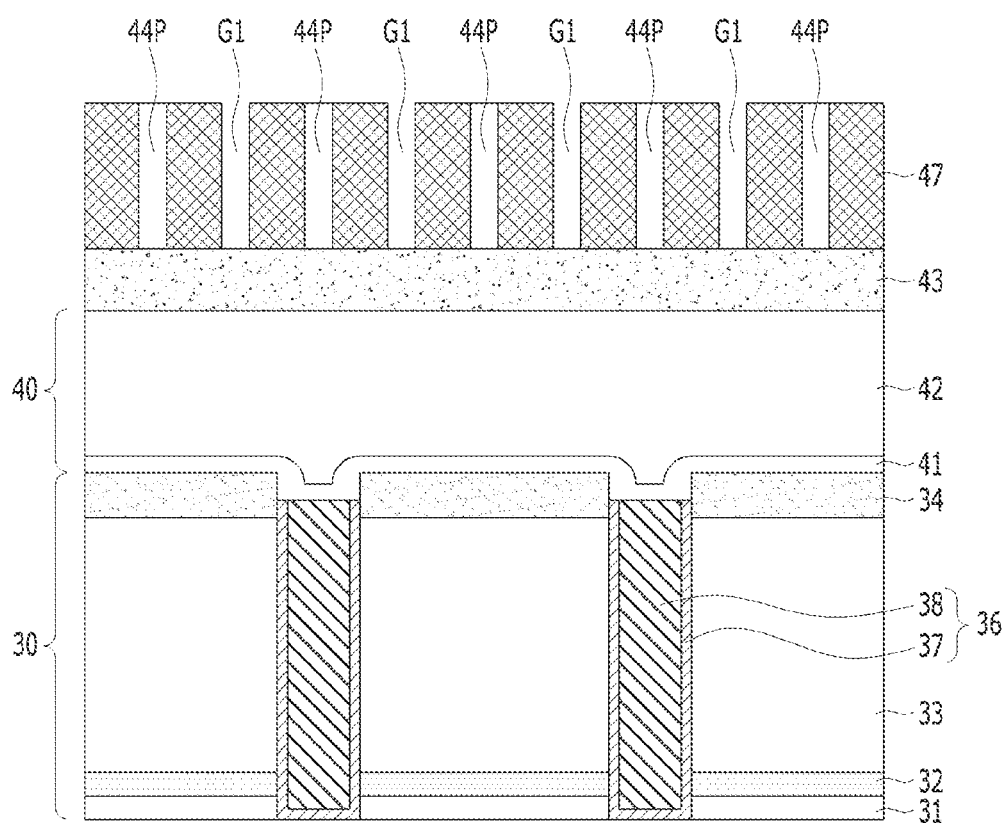

Referring to FIG. 3E, a sacrificial spacer 47 may be formed. An etch-back process of the sacrificial spacer layer 47A may be performed to form the sacrificial spacer 47. The sacrificial spacers 47 may be formed on both sidewalls of the second hard mask layer pattern 44P. The space between the sacrificial spacers 47, that is, first gaps G1 may be formed.

Figure 3F:
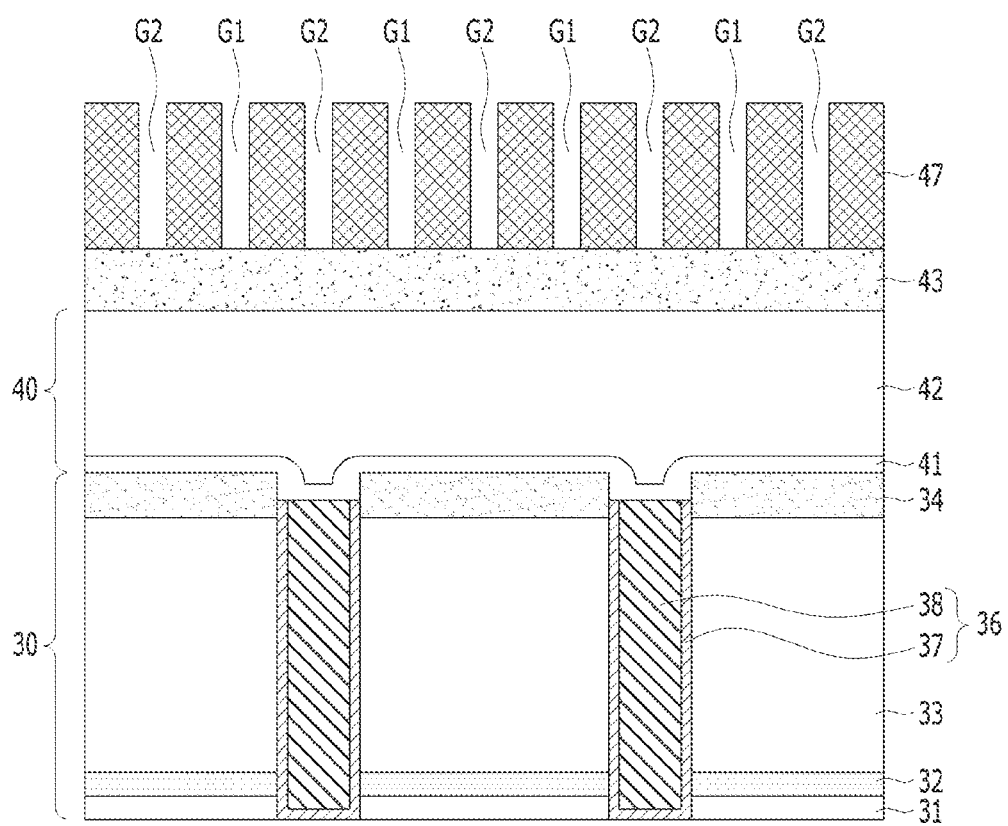

Referring to FIG. 3F, the second hard mask layer pattern 44P may be removed. As a result, second gaps G2 may be formed in the sacrificial spacer 47. A plurality of first gaps G1 and a plurality of second gaps G2 may be disposed laterally. The first gaps G1 and the second gaps G2 may be alternately positioned laterally. The first gaps G1 and the second gaps G2 may have the same line width.

Figure 3G:
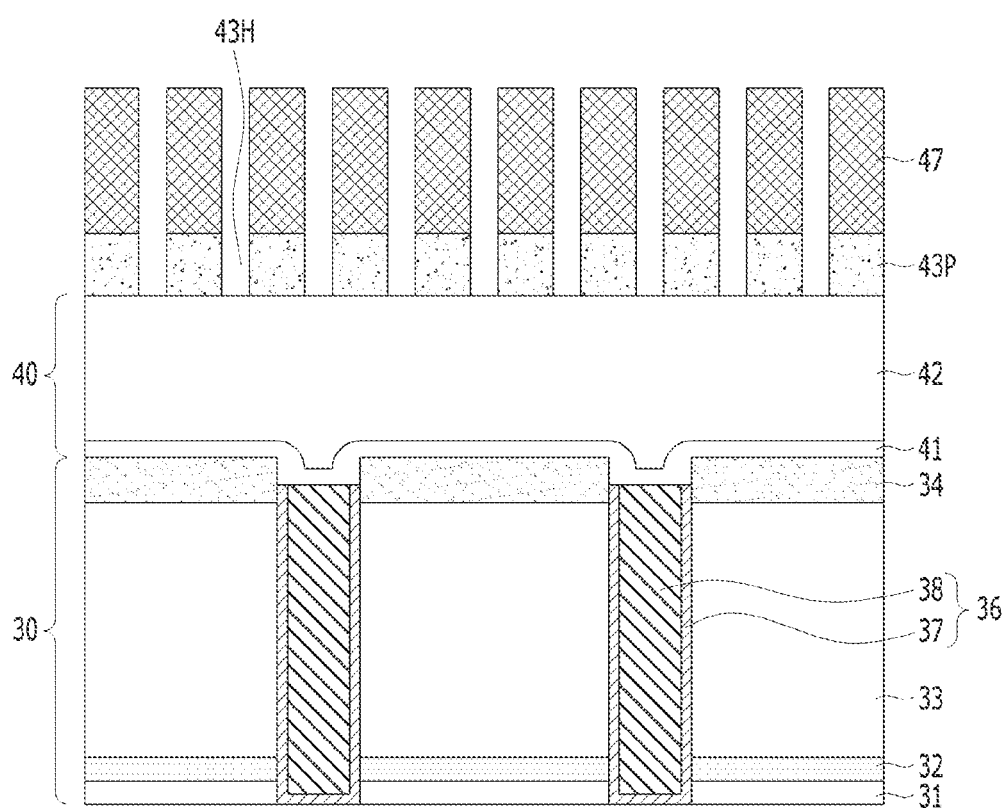

Referring to FIG. 3G, the first hard mask layer 43 may be etched by using the sacrificial spacer 47 as an etch barrier. As a result, a first hard mask layer pattern 43P may be formed. The first hard mask layer pattern 43P may include a plurality of trench-type-openings 43H.

Figure 3H:
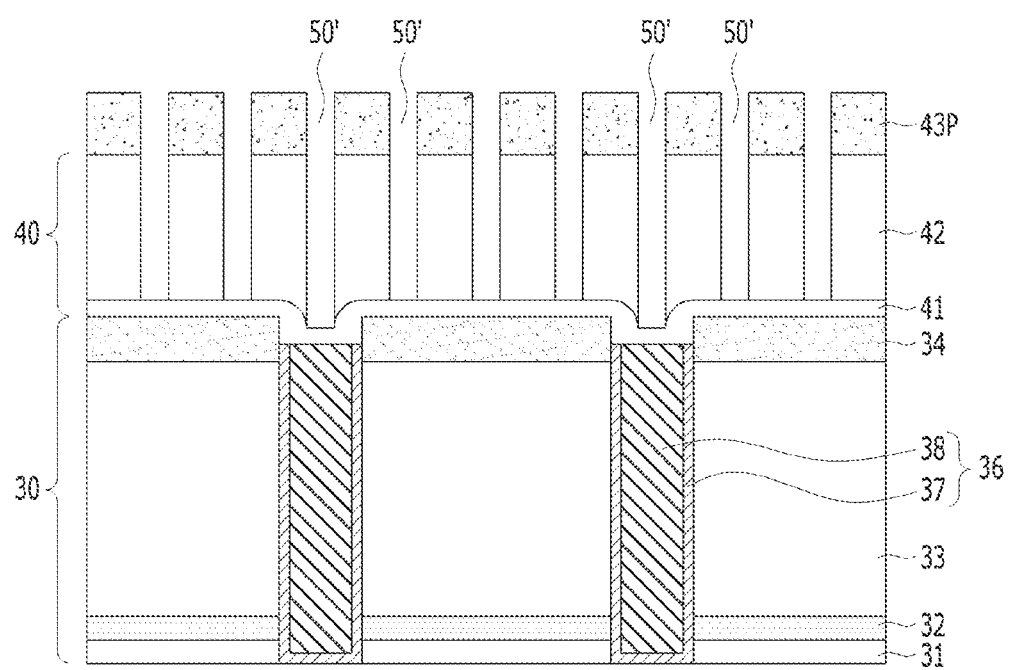

Referring to FIG. 3H, the third inter-layer dielectric layer 42 may be etched by using the first hard mask layer pattern 43P as an etch barrier. As a result, preliminary trenches 50' may be formed. An etching process for forming the preliminary trenches 50' may stop on the spacer layer 41.

Subsequently, referring to FIG. 2K, the spacer layer 41 below the preliminary trenches 50' may be etched. As a result, trenches 50 may be formed.

Subsequently, the first hard mask layer pattern 43P may be removed.

Subsequently, referring to FIG. 2L, a bit line 51 filling the trenches 50 may be formed. The bit line 51 may include a stack of a barrier layer, a seed layer, and a metal layer. The bit line 51 may include copper.

According to an embodiment, the process for coupling vertical channel structures to a bit line may be simplified.

According to an embodiment, a contact area between a contact plug and a bit line may be secured by using a spacer layer.

What is claimed is:
1. A semiconductor device, comprising:
a memory cell stack comprising dielectric layers and gate electrodes that are alternately stacked with each other, the memory cell stack positioned over a substrate;
a plurality of channel structures each including a channel layer that penetrates the memory cell stack;
a contact-level dielectric layer formed over the plurality of channel structures and including a contact hole that exposes each of the plurality of channel structures;

recessed contact plugs respectively coupled to the channel layer through the contact hole and having an upper surface which is lower than an upper surface of the contact-level dielectric layer;

a bit line-level dielectric layer formed over the recessed contact plugs; and a plurality of bit lines formed in the bit line-level dielectric layer, wherein the bit line-level dielectric layer includes a spacer layer in contact with sidewalls of bottom portions of the plurality of bit lines, wherein the contact-level dielectric layer includes:

a first inter-layer dielectric layer;

a first etch stop layer over the first inter-layer dielectric layer;

a second inter-layer dielectric layer over the first etch stop layer; and a second etch stop layer over the second inter-layer dielectric layer, wherein the second etch stop layer is covered by the spacer layer.

2. The semiconductor device of claim 1, wherein the spacer layer covers portions of an upper surface of the recessed contact plugs.

3. The semiconductor device of claim 1, wherein the spacer layer includes silicon nitride.

4. The semiconductor device of claim 1, wherein the bottom surfaces of the bit lines are self-aligned to the spacer layer.

5. The semiconductor device of claim 1, wherein the bit lines and the contact plugs are in direct contact with each other.

6. The semiconductor device of claim 1, wherein the second etch stop layer and the spacer layer include substantially the same material.

7. The semiconductor device of claim 1, wherein the recessed contact plugs include titanium nitride and tungsten.

8. The semiconductor device of claim 1, wherein the recessed contact plugs have a greater width than the bit lines.

9. The semiconductor device of claim 1, wherein the spacer layer includes rounding portions that respectively cover upper surfaces of the recessed contact plugs.

10. The semiconductor device of claim 9, wherein the rounding portions of the spacer layer cover edges of the second etch stop layer over the contact plug.

* * * * *